United States Patent [19]

Shibuya et al.

[11] Patent Number: 4,540,242
[45] Date of Patent: Sep. 10, 1985

[54] LIQUID CRYSTAL DISPLAY ELEMENT

[75] Inventors: Yoshimichi Shibuya; Masami Takahashi; Tadashi Ishibashi, all of Mobara, Japan

[73] Assignee: Hitachi, Ltd., Tokyo, Japan

[21] Appl. No.: 117,087

[22] Filed: Jan. 31, 1980

[30] Foreign Application Priority Data

Feb. 2, 1979 [JP] Japan .................................. 54-10372

[51] Int. Cl.³ ............................................... G02F 1/13
[52] U.S. Cl. ...................................... 350/335; 368/242
[58] Field of Search ................... 350/335, 336; 368/82, 368/84, 242

[56] References Cited

U.S. PATENT DOCUMENTS

| 3,675,988 | 7/1972 | Soref | 350/336 |
| 3,844,105 | 10/1974 | Kashio | 368/82 |
| 4,099,855 | 7/1978 | Wisbey et al. | 350/335 X |
| 4,247,930 | 1/1981 | Martin | 368/84 |

FOREIGN PATENT DOCUMENTS 47-32795  11/1972  Japan .

Primary Examiner—F. L. Evans
Attorney, Agent, or Firm—Antonelli, Terry & Wands

[57] ABSTRACT

A liquid crystal display element is provided which can clearly and simultaneously produce analog and digital displays. The analog display is produced by a first liquid crystal layer provided near a reflecting plate while the digital is made by a second liquid crystal layer disposed adjacent to the first liquid crystal layer.

4 Claims, 4 Drawing Figures

LIQUID CRYSTAL DISPLAY ELEMENT

This invention relates to a liquid crystal display element which can provide both analog and digital displays with high clarity, and more particularly to a liquid crystal display element of the reflection type for use in a time measuring instrument. The term "analog" used herein does not bear the same strict meaning of "analog" used in the field of electronics, but should be understood to mean a simulated analog of a dial plate of a clock.

It is a well-known technique to provide both analog and digital displays by means of a display element in which a single liquid crystal layer is interposed between two substrate plates. With this type of a display element, however, electrodes having various patterns on the substrate plates must be prevented from overlapping one another. This restriction decreases the allowable areas for analog and digital displays within a limited display section. Moreover, the layout of the electrode patterns is so complicated that faults such as short-circuiting and breakage of conductors tend to occur.

Japanese patent application Ser. No. 46-12790 (Japanese Patent Publication No. 47-32795 published on Nov. 16, 1972) discloses a display device which can display complicated characters and pictures by the use of plural liquid crystal layers. However, since the clarity of display by such a display element depends largely on the thickness of the glass face plate and the direction in which the displayed patterns are viewed, the mere provision of plural liquid crystal layers superposed one upon another will incur a problem that the display is difficult to recognize, especially in the case of simultaneous display of analog and digital representations in a time measuring instrument.

It is therefore the object of this invention to provide a liquid crystal display element of the reflection type which is capable of clearly producing both analog and digital displays simultaneously, and is especially adapted for use in a time display instrument such as a clock or a wristwatch. Here, the reflection type liquid crystal element means those of the kind in which a polarization plate iss provided directly on a reflection plate but also of the kind in which the polarization plate is spaced from the reflection plate by an intermediate layer such as an air gap or a light transmission layer.

The feature of this invention is that the liquid crystal cell of a three substrate configuration with two liquid crystal layers and that the first and second liquid crystal layers are used respectively for digital and analog displays in view of the influences of the thicknesses of the glass substrates and the differences in viewing angle upon the easiness in recognizing the display produced.

According to this invention, therefore, there is provided a liquid crystal display element of the reflection type comprising a first liquid crystal layer for producing a digital display and a second liquid crystal layer disposed between the first liquid crystal layer and a reflecting plate for producing an analog display.

The above and other objects, features and advantages of this invention will be apparent from the following description taken in conjunction with the accompanying drawings, in which.

Figure 1:
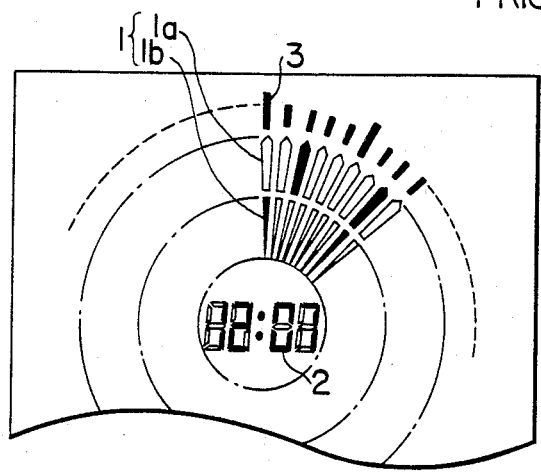
FIG. 1 shows a conventional liquid crystal display element capable of simultaneously producing an analog and a digital display.

Before the description of the embodiment of this invention, the conventional liquid crystal display element shown in FIG. 1, which can simultaneously produce both analog and digital displays, will be enlarged upon.

In FIG. 1, reference numeral 1 indicates analog display segments consisting of minute and second display segments 1a and hour and minute display segments 1b; 2 digital display segments; and 3 graduations. The analog display is made by the minute and second display segments 1a and the hour and minute display segments 1b, just as in a long-and-short-hand clock. Namely, as shown in FIG. 1, the analog display reads 12:07:02, that is, seven minutes and two seconds after twelve. The digital display is produced by the digital display segment 2 located in the center of the display element. In the analog representation, the positions of the long hand (segment 1a plus corresponding segment 1b) and the short hand (segment 1b) can be identified with respect to the graduation 3 provided around the minute and second segments 1a. This graduation 3 is formed on the surface of the lower glass plate or a lower polarizing plate by, for example, printing. In the case where the above described double display, i.e. simultaneous analog and digital representations, is achieved by an element using a single liquid crystal layer, it is necessary for the electrodes for analog display to be prevented from overlapping the electrodes for digital display. Accordingly, in this case, the size of the digital display section is rather reduced so that the displayed figures are hard to recognize. On the other hand, the length of each of the hour and minute segments 1b, which are among the analog display segments 1, is also limited since the central portion of the display section must be occupied by the digital display segments 2. Namely, the provision of the analog display system (or the digital display system) counteracts that of the digital display system (or the analog display system) so that both the systems are only halfway satisfactory. Further, the layout of the electrodes in the central portion is so complicated that faults such as short-circuiting and breaks of conductors tend to occur.

Figure 2:
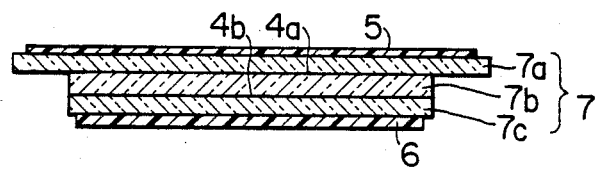
FIG. 2 shows in cross section a liquid crystal display element as one embodiment of this invention.

FIG. 2 shows in cross section a twisted nematic type liquid crystal element as an embodiment of this invention. In FIG. 2, reference numeral 4a indicates a first liquid crystal layer; 4b a second liquid crystal layer; 5 an upper polarizing plate; 6 a lower polarizing plate (with a reflecting plate, not shown, on the outer side); and 7a, 7b and 7c a first, a second and a third glass plates respectively.

Figure 3:
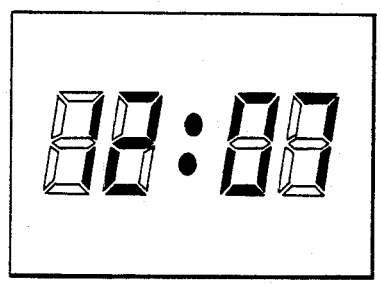
FIG. 3 shows an example of the display by the first liquid crystal layer of the element shown in FIG. 2.
Figure 4:
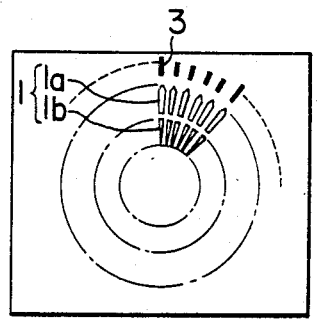
FIG. 4 shows an example of the display by the second liquid crystal layer of the element shown in FIG. 2.

FIG. 3 shows the digital representation produced gy the first liquid crystal layer 4a of the display element shown in FIG. 2 and FIG. 4 shows the analog representation made by the second liquid crystal layer 4b of the same element. The reason why the analog display is made by the second liquid crystal layer 4b, is that since the analog display is observed with respect to the graduation formed by, for example, printing on the surface of the third (lower) glass plate 7c or the lower polarizing plate 6, then the display of the long and short hands for analog display along with the graduation must be prevented from being obscured depending on the direction of incident light and the viewing angle. Namely, the shadows of the hands cast on the reflecting plate will deviate from the displayed hands on the display section of the liquid crystal layer depending on the direction of incident light and the viewing angle, but when the distance between the reflecting plate and the liquid crystal layer is small, the displayed hands and their shadows almost coincide in position with each other so that the display is very clear. If the first liquid crystal layer is used to produce analog display, the distance from the display hands to their shadows equals the sum of the thickness of the second glass plate 7b, the third glass plate 7c and the lower polarizing plate 6, the total thickness being about 1.3 mm. On the other hand, in the case described above where the second liquid crystal layer performs analog display, the distance between the displayed hands and their shadows equals about 0.75 mm, i.e. the sum of the thicknesses of the third glass plate 7c and the lower polarizing plate 6, so that the display is very clear, almost free from influence by shadows. Also in the digital display produced on the first liquid crystal layer, the shadows of the displayed figures are cast on the reflecting plate, but since in this case the display is digital, the error in reading the displayed figures hardly occurs. According to the twisted nematic type liquid crystal display element embodying this invention, the orientations of the liquid crystals in the first and the second liquid crystal layers are different from each other and the contrast of the display in the first liquid crystal layer is different from that of the display in the second liquid crystal layer except in a very specific case. For example, one display looks dark and the other grey. Therefore, even in the case where analog and digital displays overlap each other to a certain extent, each display can be distinctly identified since not only the ways of representation but also the contrasts of the displayed images in the analog and the digital displays are different from each other. Namely, the sizes of the analog and the digital display sections can be independently made large enough to be easily recognized since in this case the partial overlap of analog display with digital one never causes a fatal disturbance to each display.

What we claim is:

1. A reflection type liquid crystal display element comprising a first liquid crystal layer including first means for producing a digital display, and a second liquid crystal layer provided between said first liquid crystal layer and a reflecting plate and including second means for producing an analog display, said first and second means being segregated with respect to one another so that said analog and digital displays are not overlapping one another in the viewing direction from said first liquid crystal layer toward said reflecting plate.

2. A reflection type liquid crystal display element as claimed in claim 1, wherein said element has a three substrate plate configuration in which said first liquid crystal layer is sandwiched between first and second substrate plates and said second liquid crystal layer is sandwiched between said second substrate plate and a third substrate plate.

3. A reflection type liquid crystal display element as claimed in claim 1, wherein said first liquid crystal layer has a digital display section located in the central portion of said element and said second liquid crystal layer has an analog display section surrounding said digital display section.

4. A reflection type liquid crystal display element as claimed in claim 1, wherein said element is used in a digital-analog time measuring instrument and said second liquid crystal layer has a first set of segments for indicating minutes and seconds and a second set of segments for indicating hours and minutes.

* * * * *